United States Patent
Ikuta et al.

(10) Patent No.: US 8,402,786 B2
(45) Date of Patent: Mar. 26, 2013

(54) SYNTHETIC SILICA GLASS OPTICAL COMPONENT AND PROCESS FOR ITS PRODUCTION

(75) Inventors: Yoshiaki Ikuta, Yokohama (JP); Shinya Kikugawa, Yokohama (JP); Akio Masui, Tokyo (JP); Noriaki Shimodaira, Yokohama (JP); Shuhei Yoshizawa, Tokyo (JP)

(73) Assignee: Asahi Glass Company, Limited, Tokyo (JP)

( * ) Notice: Subject to any disclaimer, the term of this patent is extended or adjusted under 35 U.S.C. 154(b) by 1216 days.

(21) Appl. No.: 10/283,055

(22) Filed: Oct. 30, 2002

(65) Prior Publication Data

US 2003/0051507 A1 Mar. 20, 2003

Related U.S. Application Data

(62) Division of application No. 09/600,153, filed as application No. PCT/JP99/00383 on Jan. 29, 1999, now abandoned.

(30) Foreign Application Priority Data

Jan. 30, 1998 (JP) ........................ 10-19751

(51) Int. Cl.
C03B 25/00 (2006.01)

(52) U.S. Cl. .................. 65/41; 65/117; 65/118; 65/119; 65/392; 65/111

(58) Field of Classification Search .............. 65/41, 117, 65/392, 17.3, 17.4, 17.5, 17.6, 111, 118, 65/119
See application file for complete search history.

(56) References Cited

U.S. PATENT DOCUMENTS

| 5,326,729 | A |   | 7/1994  | Yaba et al.            |
|-----------|---|---|---------|------------------------|
| 5,679,125 | A | * | 10/1997 | Hiraiwa et al. ... 65/397 |
| 5,908,482 | A | * | 6/1999  | Komine et al. ... 65/17.6 |
| 6,475,575 | B1|   | 11/2002 | Ikuta et al.           |
| 6,499,317 | B1|   | 12/2002 | Ikuta et al.           |
| 6,544,914 | B1|   | 4/2003  | Kikugawa et al.        |

FOREIGN PATENT DOCUMENTS

| EP | 0 401 845 | 12/1990 |
| EP | 0 483 752 A2 | 5/1992 |
| EP | 0 737 654 A1 | 10/1996 |
| JP | 4-164833 | 6/1992 |
| JP | 5-32432 | 2/1993 |
| JP | 6-166528 | 6/1994 |
| JP | Hei-8-81225 | 3/1996 |
| JP | 9-59034 | 3/1997 |
| JP | A-H06-166528 | 3/1997 |
| JP | A-H09-59034 | 3/1997 |

OTHER PUBLICATIONS

English translation of the Facts and Arguments presented in support of the opposition filed by Heraeus Quarzglas GmbH & Co. KG on Apr. 30, 2004, European patent EP 1 061 052 B1, 10 pages.
H. Hosono et al, "Experimental evidence for the Si-Si bond model of the 7.6-e.V. band in $SiO_2$ glass", Physical Review B, 1991, vol. 44, No. 21, pp. 12043-12045.
B. Uebbing, et al., "Modified fused silica for 157 nm mask substrates", 16th European Conference on Mask Technology for Integrated Circuits and Microcomponents, vol. 3996, pp. 218-223 (Feb. 3, 2000).

* cited by examiner

*Primary Examiner* — Queenie Dehghan
(74) *Attorney, Agent, or Firm* — Oblon, Spivak, McClelland, Maier & Neustadt, L.L.P.

(57) ABSTRACT

A process for producing a synthetic silica glass optical component which contains at least $1 \times 10^{17}$ molecules/cm$^3$ and has an OH concentration of at most 200 ppm and substantially no reduction type defects, by treating a synthetic silica glass having a hydrogen molecule content of less than $1 \times 10^{17}$ molecules/cm$^3$ at a temperature of from 300 to 600° C. in a hydrogen gas-containing atmosphere at a pressure of from 2 to 30 atms.

7 Claims, No Drawings

SYNTHETIC SILICA GLASS OPTICAL COMPONENT AND PROCESS FOR ITS PRODUCTION

This application is a Division of application Ser. No. 09/600,153 filed on Sep. 13, 2000 now abandoned, originally filed as international application no. PCT/JP99/00383 filed on Jan. 29, 1999, now abandoned.

TECHNICAL FIELD

The present invention relates to a synthetic silica glass optical component and a process for its production. Particularly, it relates to an optical component for an apparatus wherein an ultraviolet light laser having a wavelength of at most 400 nm (particularly a KrF or ArF excimer laser) is used as a light source, and a process for its production. Particularly, it relates to a synthetic silica glass optical component such as a lens, a window member, a mirror, a prism or a filter, and a process for its production.

BACKGROUND ART

Synthetic silica glass has characteristics such that it is a material transparent over a wide range of wavelength region from a near infrared region to a vacuum ultraviolet region, the thermal expansion coefficient is very small, it is excellent in dimensional stability, and it contains no substantial metal impurities and is highly pure, and it has hence been used mainly for optical components for optical apparatus wherein conventional g-line or i-line is used as a light source.

In recent years, along with high integration of LSI, a technique for fine patterning with a narrower line width has been required in the lithographic technology for drawing an integrated circuit pattern on a wafer, and for this purpose, shortening of the wavelength of the light source for exposure is being advanced. Namely, for example, the light source for a lithographic stepper has been advanced from conventional g-line (wavelength: 436 nm) or i-line (wavelength: 365 nm) to adopt a KrF excimer laser (wavelength: 248 nm) or an ArF excimer laser (wavelength: 193 nm) and the optical component to be used for the above-mentioned stepper is required to have light transmittance, stability and durability up to a short wave region of about 190 nm.

When conventional synthetic silica glass is irradiated with a high energy beam of e.g. a KrF or ArF excimer laser, new absorption bands will be formed in an ultraviolet region, and thus, it has a problem as an optical component for constituting an optical system wherein such an excimer laser is used as a power source. Namely, when it is irradiated with the above laser for a long period of time, an absorption band at about 215 nm due to E' center and an absorption band at about 260 nm due to NBOHC (non-crosslinking oxygen radical) will be formed.

It is considered that such absorption bands are formed, as inherent defects due to oxygen deficient type defects such as ≡Si—Si≡ and oxygen excessive type defects such as ≡Si—O—O—Si≡ in the synthetic silica glass undergo photo-reactions by irradiation with a laser light. These absorption bands will cause deterioration of the transmittance, increase of the absolute refractive index, change in the refractive index distribution or generation of fluorescence.

Various methods have been studied as methods for solving these problems, and it is known to be effective to incorporate hydrogen molecules in synthetic silica glass. For example, JP-A-3-88742 discloses a method wherein synthetic silica glass is permitted to contain hydrogen molecules in an amount of at least $5 \times 10^{16}$ molecules/cm$^3$ and OH groups in an amount of at least 100 ppm, to increase the durability to ultraviolet light.

However, with the synthetic silica glass containing OH groups in an amount of at least 100 ppm and hydrogen molecules in an amount of at least $5 \times 10^{16}$ molecules/cm$^3$ in JP-A-3-88742, there has been a problem such that when irradiated with a laser light, it generates a red color fluorescence of 650 nm, although formation of the absorption band at about 215 nm may be suppressed, and improvements may be obtained with respect to deterioration of the transmittance, increase of the absolute refractive index or change of the refractive index distribution when irradiated with an ArF or KrF excimer laser light for a long period of time. This red color fluorescent band of 650 nm is simultaneously accompanied by an absorption band at 260 nm and thus creates a serious problem especially when it is used for an optical component of an apparatus wherein a KrF excimer laser having a wavelength close thereto is used as a light source.

As a means to dope hydrogen molecules, JP-A-1-201664 discloses a technique for carrying out heat treatment at a high temperature at a level of from 800 to 1000° C. Further, JP-A-6-166522 discloses a technique to incorporate hydrogen at a concentration of at least $1 \times 10^{17}$ molecules/cm$^3$ into synthetic silica glass by maintaining it at a low temperature of a level of from 300 to 600° C. in a hydrogen-containing atmosphere under a pressure of at least 1 atm, since if hydrogen doping is carried out at a high temperature at a level of from 800 to 1000° C., reduction type defects due to hydrogen will form in the synthetic silica glass. Specifically, it is concluded that it is preferred to carry out hydrogen doping at 100 atms and 1 atm, respectively, and it is particularly preferred to carry out hydrogen doping under a high pressure of at least 50 atms.

Whereas, in the case of a stepper wherein a KrF excimer laser is used as a light source, it is advisable to control the decrease in the transmittance of light of 248 nm after irradiation of $10^6$ shots of a KrF excimer laser light under conditions of an energy density of 400 mJ/cm$^2$/Pulse and a frequency of 100 Hz, to be at most 0.1%. For this purpose, it is necessary to control the change in absorption coefficient at about 215 nm (e.g. 214 nm) when a KrF excimer laser light is irradiated under the above conditions, to be at most $2.1 \times 10^{-2}$. In JP-A-6-166522, the decrease in transmittance is measured by irradiating $5 \times 10^6$ shots of a KrF excimer laser light under conditions of an energy density of 150 mJ/cm$^2$/Pulse and a frequency of 100 Hz, but by such a measuring method, the energy density of the KrF excimer laser light is so small that it is not adequate as a measuring method in recent years where higher excimer laser resistance is required.

The present inventors have conducted further detailed studies on the hydrogen molecule doping method by using a KrF excimer laser having a higher energy density and as a result, have found that even if hydrogen is doped under a high pressure as recommended in JP-A-6-166522, it is not necessarily possible to obtain a synthetic silica glass having adequate laser resistance.

Namely, in the case of a silica glass containing hydrogen molecules in an amount of at least $1 \times 10^{17}$ molecules/cm$^3$, formation of hydrogen bond type defects such as ≡Si—H and oxygen deficient type defects such as ≡Si—Si≡ (hereinafter, ≡Si—H and ≡Si—Si≡ will be referred to as reduction type defects) by carrying out treatment at 500° C. under a hydrogen pressure of 100 atms, has been confirmed by the measurement by e.g. Raman spectrometry or vacuum ultraviolet spectrometry, and further, under irradiation with a laser light, a substantial absorption peak has been observed at about 215 nm. This strong absorption peak at about 215 nm has a skirt extending over a wide wavelength region of from 180 to 250 nm and hence is problematic when used for an optical component of an optical apparatus wherein an ArF excimer laser or a KrF excimer laser is used as a light source.

It is an object of the present invention to provide a process for producing a synthetic silica glass optical component, whereby a synthetic silica glass optical component having substantially no reduction type defects and containing hydrogen can be obtained with good productivity.

Further, it is an object of the present invention to provide a synthetic silica glass optical component which is free from generation of fluorescence or decrease in transmittance even when irradiated by an excimer laser light, and a process for its production.

DISCLOSURE OF THE INVENTION

As a result of a study to solve such problems, the present inventors have found for the first time that among the conditions at the time of hydrogen doping treatment, not only the temperature condition but also the pressure condition of the atmosphere is an important factor. Namely, it has been found that as the pressure increases, reduction type defects due to hydrogen tend to form, and the critical temperature for forming reduction type defects due to hydrogen tends to be low.

The present invention provides a process for producing a synthetic silica glass optical component to be used by irradiating a laser light within an ultraviolet light wavelength region, which comprises a step (hereinafter referred to as a hydrogen-incorporating step) of treating a synthetic silica glass having a hydrogen molecule content of less than $1 \times 10^{17}$ molecules/cm$^3$ at a temperature of from 300 to 600° C. in a hydrogen gas-containing atmosphere at a pressure of from 2 to 30 atms, to obtain a synthetic silica glass optical component which has a hydrogen molecule content of at least $1 \times 10^{17}$ molecules/cm$^3$ and an OH group concentration of at most 200 ppm and contains substantially no reduction type defects.

In the present invention, it is important that the synthetic silica glass prior to the hydrogen-incorporating step has a hydrogen molecule content of less than $1 \times 10^{17}$ molecules/cm$^3$. If the hydrogen molecule content is at least $1 \times 10^{17}$ molecules/cm$^3$, it is likely that reduction type defects will be formed during a temperature raising process in the hydrogen-incorporating step. For a synthetic silica glass optical component to be used as a stepper lens or other optical component, it is necessary to carry out forming and heat-treatment such as annealing in order to impart optical characteristics required as an optical component, and for such heat-treatment, a high temperature at a level of from 800 to 1500° C. is required. Accordingly, even if the hydrogen molecule content is made to be at least $1 \times 10^{17}$ molecules/cm$^3$ without creating reduction type defects in the above-mentioned hydrogen-incorporating step, if the subsequent heat treatment is carried out at a temperature of at least 600° C., it is likely that reduction type defects will form due to the incorporated hydrogen. Therefore, the heat treatment which is carried out at a temperature of at least 600° C., is preferably carried out prior to the hydrogen-incorporating step. The heat treatment which is carried out at a temperature of at least 600° C. includes forming and annealing. Further, "forming" in the present invention includes (homogenizing) treatment which comprises heating (the entirety or a local portion) to a predetermined temperature and maintaining it at that temperature for a predetermined period of time to make the density distribution and the refractive index distribution uniform.

Further, in a case where the synthetic silica glass prior to the hydrogen-incorporating step already contains reduction type defects, more reduction type defects tend to be formed by hydrogen. Accordingly, in the present invention, the synthetic silica glass prior to the hydrogen-incorporating step is preferably a synthetic silica glass to which forming by heating and annealing have been applied and which has a hydrogen molecule content of less than $1 \times 10^{17}$ molecules/cm$^3$ and contains no substantial reduction type defects.

Further, the synthetic silica glass prior to the hydrogen-incorporating step is preferably a synthetic silica glass to which forming by heating and annealing have been applied and which has a hydrogen molecule content of less than $1 \times 10^{17}$ molecules/cm$^3$ and an OH group concentration of at most 200 ppm and contains substantially no reduction type defects.

Further, from the viewpoint of the durability (a characteristic such that the transmittance will not deteriorate even under irradiation with an excimer laser light), it is important that the obtainable synthetic silica glass optical component is a synthetic silica glass optical component which has a hydrogen molecule content of at least $1 \times 10^{17}$ molecules/cm$^3$ and an OH group concentration of at most 200 ppm and which contains substantially no reduction type defects.

In the present invention, "contains substantially no reduction type defects" has the following meaning. Namely, with respect to ≡Si—Si≡, the absorption k of light of 163 nm in a vacuum ultraviolet region is $k \leq 2 \times 10^{-2}$ (not higher than the detectable limit). Further, with respect to ≡Si—H, the value $I_{2250}/I_{800}$ obtained by dividing the intensity $I_{2250}$ detected from the scattering peak of 2250 cm$^{-1}$ of a laser Raman spectrum by the intensity $I_{800}$ of a scattering peak of 800 cm$^{-1}$ showing a ≡Si—O— bond, is $I_{2250}/I_{800} \leq 1 \times 10^{-4}$ (not higher than the detectable limit).

In the present invention, it is important to bring the hydrogen molecule content to at least $1 \times 10^{17}$ molecules/cm$^3$ by the hydrogen-incorporating step. In particular, from the viewpoint of the durability, it is preferred to bring it to at least $5 \times 10^{17}$ molecules/cm$^3$.

The hydrogen-incorporating step is carried out at a temperature of from 300 to 600° C. under a pressure of a hydrogen-containing gas of from 2 to 30 atms. If the pressure exceeds 30 atms or if the temperature exceeds 600° C., reduction type defects are likely to form. Especially when treatment is carried out at a pressure exceeding 30 atms, the obtained synthetic silica glass optical component is likely to undergo self-destruction later. This is believed to be attributable to a strain in the structure formed during the production under a high pressure. If the pressure is less than 2 atms or if the temperature is lower than 300° C., the treating time required to incorporate at least $1 \times 10^{17}$ molecules/cm$^3$ of hydrogen molecules tends to be too long. Further, if the pressure is less than 2 atms or if the temperature is lower than 300° C., it tends to be difficult to bring the hydrogen molecule content to at least $5 \times 10^{17}$ molecules/cm$^3$. Preferably, it is carried out at a pressure of from 5 to 20 atms at a temperature of from 400 to 600° C. In this specification, "atms" means the absolute pressure.

The hydrogen gas-containing atmosphere may, for example, be an atmosphere composed solely of hydrogen gas or an atmosphere composed of an inert gas which contains hydrogen gas.

The present invention also provides a synthetic silica glass optical component to be used by irradiating a laser light within an ultraviolet light wavelength region, which has an OH group concentration of at most 200 ppm and a hydrogen molecule content of at least $1\times10^{17}$ molecules/cm$^3$ and which contains substantially no reduction type defects.

The present inventors have prepared synthetic silica glasses containing at least $1\times10^{17}$ molecules/cm$^3$ of hydrogen molecules and containing OH groups having different concentrations within a range of from 20 to 1000 ppm, and carried out laser light irradiation tests, whereby it has been confirmed that the intensity of 650 nm red color fluorescence increases in proportion to an increase of the OH group concentration. Namely, it has been found that under irradiation with a laser light, OH groups in the synthetic silica glass are converted to non-crosslinking oxygen radicals ≡SiO. by the following Formula (1) to form a red color fluorescence band of 650 nm.

  (1)

Further, OH groups are precursors for the defects having an absorption band at 260 nm, and if there exist many OH groups, such defects are likely to form. The present inventors have confirmed that the decrease in transmittance during irradiation with a laser light can be suppressed if the hydrogen molecule content is at least $1\times10^{17}$ molecules/cm$^3$, and the OH group concentration is at most 200 ppm.

For the same reason as described above, the hydrogen molecule content in the synthetic silica glass optical component of the present invention is preferably at least $5\times10^{17}$ molecules/cm$^3$.

Further, the OH group concentration of the synthetic silica glass optical component of the present invention is preferably at most 100 ppm, more preferably at most 30 ppm.

BEST MODE FOR CARRYING OUT THE INVENTION

Examples

Examples 1 to 10

Fine particles of silica glass obtained by heat hydrolysis (flame hydrolysis) in an oxyhydrogen flame of SiCl$_4$ as a silica glass-forming material, were deposited and grown on a substrate to form a porous silicate glass body. Then, it was heated to 1450° C. in a He gas atmosphere for transparent vitrification to obtain a transparent glass body. Then, it was heated at a temperature of at least 1700° C. in a forming container made of graphite to form it into a desired shape. Further, annealing was carried out at a cooling rate of 10° C./hr from 1300° C. to 1000° C. to prepare a synthetic silica glass having a hydrogen molecule content of less than $1\times10^{17}$ molecules/cm$^3$, an OH group concentration of 80 ppm and containing no reduction type defects. The obtained synthetic silica glass (size: 30 mm in diameter×20 mm) having no reduction type defects was subjected to hydrogen doping in an atmosphere composed solely of hydrogen gas under the conditions of the temperature and the pressure as shown in Table 1 until the hydrogen molecule content became at least $1\times10^{17}$ molecules/cm$^3$ (the treating time as shown in Table 1). Examples 1 to 5 and 8 correspond to Working Example of the invention, and Examples 6, 7, 9 and 10 correspond to Comparative Examples.

The OH group concentration of the synthetic silica glasses obtained in Examples 1 to 10 was 80 ppm. With respect to the obtained various synthetic silica glasses, the following evaluations were carried out. In Example 8, the hydrogen pressure was so low that it took long time for the treatment.

Further, the hydrogen molecule content was obtained as follows. Namely, Raman spectrometry was carried out, and the hydrogen molecule content (molecules/cm$^3$) was obtained from the intensity ratio ($=I_{4135}/I_{800}$) of the intensity $I_{4135}$ detected from the scattering peak of 4135 cm$^{-1}$ of the laser Raman spectrum to the intensity $I_{800}$ of the scattering peak of 800 cm$^{-1}$ representing the fundamental vibration between silicon and oxygen (V. S. Khotimchenko et. al., Zhurnal Prikladnoi Spektroskopii, 46(6), 987-997 (1986)). Here, the detectable limit by this method is $5\times10^{16}$ molecules/cm$^3$.

Evaluation 1

Vacuum ultraviolet spectrometry (VTMS-502, manufactured by Acton Research Company) was carried out, and the ≡Si—Si≡ concentration was evaluated from the absorption $k_{163}$ of light of 163 nm. N.D. indicates not detectable.

Evaluation 2

Raman spectrometry was carried out, and the ≡Si—H concentration was evaluated from the value $I_{2250}/I_{800}$ obtained by dividing the intensity $I_{2250}$ detected from the scattering peak of 2250 cm$^{-1}$ of the laser Raman spectrum by the intensity $I_{800}$ of the scattering peak of 800 cm$^{-1}$ representing the ≡Si—O— bond. N.D. indicates not detectable.

Evaluation 3

A KrF excimer laser light (LPX-100, manufactured by Lambda Physik Company) was irradiated perpendicularly to the surface of 30 mm in diameter under such conditions that the energy density was 400 mJ/cm$^2$/Pulse and the frequency was 100 Hz. The transmittance at 214 nm immediately after irradiation of the KrF excimer laser light for 3.0 hours, was measured by a spectrophotometer (U-3210, manufactured by Hitachi Seisakusho), and the absorption coefficient of light of 214 nm was obtained, whereby evaluation was carried out by the change $\Delta k_{214}$ of the absorption coefficient between before and after the KrF excimer laser light irradiation.

The results of the foregoing respective evaluations are shown in Table 2. In Examples 6, 7, 9 and 10, reduction type defects are observed, and deterioration of the transmittance by the laser light irradiation is also observed.

TABLE 1

|  | Temperature (° C.) | Pressure (atm) | Treating time (hr) |
|---|---|---|---|
| Example 1 | 500 | 2 | 67 |
| Example 2 | 500 | 5 | 48 |
| Example 3 | 500 | 10 | 39 |
| Example 4 | 550 | 10 | 28 |
| Example 5 | 600 | 10 | 21 |
| Example 6 | 650 | 10 | 17 |
| Example 7 | 700 | 10 | 13 |
| Example 8 | 500 | 1 | 94 |
| Example 9 | 500 | 50 | 27 |
| Example 10 | 500 | 100 | 23 |

TABLE 2

|  | Evaluation 1 $k_{163}$ (cm$^{-1}$) | Evaluation 2 $I_{2250}/I_{800}$ (—) | Evaluation 3 $\Delta k_{214}$ (cm$^{-1}$) |
|---|---|---|---|
| Example 1 | N.D. | N.D. | $3.84\times10^{-3}$ |
| Example 2 | N.D. | N.D. | $2.79\times10^{-3}$ |
| Example 3 | N.D. | N.D. | $2.11\times10^{-3}$ |
| Example 4 | N.D. | N.D. | $5.36\times10^{-3}$ |

TABLE 2-continued

|  | Evaluation 1 $k_{163}$ (cm$^{-1}$) | Evaluation 2 $I_{2250}/I_{800}$ (—) | Evaluation 3 $\Delta k_{214}$ (cm$^{-1}$) |
|---|---|---|---|
| Example 5 | N.D. | N.D. | $1.43 \times 10^{-2}$ |
| Example 6 | 0.08 | $3.91 \times 10^{-3}$ | $5.98 \times 10^{-2}$ |
| Example 7 | 0.12 | $3.00 \times 10^{-2}$ | $9.20 \times 10^{-2}$ |
| Example 8 | N.D. | N.D. | $5.13 \times 10^{-3}$ |
| Example 9 | 0.08 | $2.31 \times 10^{-4}$ | $3.34 \times 10^{-2}$ |
| Example 10 | 0.10 | $1.49 \times 10^{-3}$ | $3.60 \times 10^{-2}$ |

Examples 11 to 20

In the same manner as in Example 1 except that the OH group concentration was adjusted to be various concentrations, synthetic silica glasses having a hydrogen molecule content of less than $1 \times 10^{17}$ molecules/cm$^3$ and having no reduction type defects, were prepared.

The obtained synthetic silica glasses (size: 30 mm in diameter×20 mm) having various OH group concentrations and having no reduction type defects, were subjected to hydrogen doping treatment in an atmosphere composed solely of hydrogen gas at the temperature under the pressure for the time as identified in Table 3 to obtain various synthetic silica glasses differing in the hydrogen concentration and the OH group concentration as shown in Table 4. The obtained various synthetic silica glasses all contained substantially no reduction type defects. Further, the OH group concentrations were the same as the concentrations prior to the hydrogen-incorporating step.

The obtained various synthetic silica glasses were processed into a size of 30 mm in diameter×10 mm, and a surface of 30 mm in diameter on each side was mirror-finished to obtain samples for irradiation with a laser light. To these samples, a KrF excimer laser light (LPX-100, manufactured by Lambda Physik Company) was irradiated perpendicularly to the surface of 30 mm in diameter under such conditions that the energy density was 400 mJ/cm$^2$/Pulse and the frequency was 100 Hz. The transmittance at 248 nm immediately after irradiation with the KrF excimer laser light for 3.0 hours, was measured by a spectrophotometer (U-3210, manufactured by Hitachi Seisakusho), whereby the deterioration in the transmittance (the difference between the transmittance before the irradiation and the transmittance after the irradiation) of light of 248 nm by the irradiation with the KrF excimer laser light, was evaluated. The results are shown in Table 4. Further, the red color fluorescence (650 nm) generated from the synthetic silica glass during the irradiation with the KrF excimer laser light, was collected by an optical fiber, and the fluorescence intensity (optional unit) was measured by means of an instant multi-photometric system (MCPD-2000, manufactured by Ohtsuka Denshi K.K.). The results are also shown in Table 4. N.D. indicates not detectable. In Examples 17 to 19 wherein the OH group concentration exceeded 200 ppm and in Example 20 wherein the hydrogen molecule content was less than $1 \times 10^{17}$ molecules/cm$^3$, the red color fluorescence intensities were high. Examples 11 to 16 correspond to Working Examples of the invention, and Examples 17 to 20 corresponds to Comparative Examples.

TABLE 3

|  | Temperature (° C.) | Pressure (atm) | Time (hr) |
|---|---|---|---|
| Example 11 | 400 | 2 | 95 |
| Example 12 | 500 | 2 | 150 |
| Example 13 | 500 | 10 | 95 |

TABLE 3-continued

|  | Temperature (° C.) | Pressure (atm) | Time (hr) |
|---|---|---|---|
| Example 14 | 450 | 10 | 150 |
| Example 15 | 600 | 10 | 150 |
| Example 16 | 500 | 10 | 150 |
| Example 17 | 500 | 10 | 95 |
| Example 18 | 500 | 10 | 95 |
| Example 19 | 500 | 10 | 150 |
| Example 20 | 500 | 1 | 95 |

TABLE 4

|  | Hydrogen concentration (molecules/cm$^3$) | OH group concentration (ppm) | Decrease in transmittance at 248 nm (%) | Intensity of red fluorescence (650 nm) |
|---|---|---|---|---|
| Example 11 | $1.40 \times 10^{17}$ | 85 | 0.038 | 0.006 |
| Example 12 | $5.17 \times 10^{17}$ | 90 | 0.023 | 0.006 |
| Example 13 | $1.27 \times 10^{18}$ | 80 | 0.018 | 0.005 |
| Example 14 | $3.46 \times 10^{18}$ | 100 | 0.015 | 0.007 |
| Example 15 | $3.26 \times 10^{18}$ | 180 | 0.016 | 0.012 |
| Example 16 | $3.30 \times 10^{18}$ | 28 | 0.014 | N.D. |
| Example 17 | $1.05 \times 10^{18}$ | 280 | 0.020 | 0.022 |
| Example 18 | $1.27 \times 10^{18}$ | 626 | 0.025 | 0.050 |
| Example 19 | $4.39 \times 10^{18}$ | 1049 | 0.021 | 0.072 |
| Example 20 | $1.22 \times 10^{16}$ | 80 | 0.087 | 0.050 |

INDUSTRIAL APPLICABILITY

According to the present invention, a synthetic silica glass optical component having substantially no reduction type defects and containing hydrogen molecules, can be obtained with good productivity.

Further, according to the present invention, it is possible to obtain a synthetic silica glass optical component whereby deterioration in the transmittance or generation of the fluorescence, by irradiation with an excimer laser light, is little.

The invention claimed is:

1. A process for producing a synthetic silica glass optical component to be used by irradiating a laser light within an ultraviolet light wavelength region, which comprises a step of treating a synthetic silica glass having a hydrogen molecule content of less than $1 \times 10^{17}$ molecules/cm$^3$ at a temperature of from 300 to 600° C. in a hydrogen gas-containing atmosphere at a pressure of from 5 to 30 atms, to obtain a synthetic silica glass optical component which has a hydrogen molecule content of at least $1 \times 10^{17}$ molecules/cm$^3$ and an OH group concentration of at most 30 ppm and contains reduction type defects not higher than the detectable limit, wherein the synthetic silica glass prior to the treatment at a temperature of from 300 to 600° C. in a hydrogen gas-containing atmosphere at a pressure of from 5 to 30 atms, is a synthetic silica glass to which forming by heating and annealing have been applied, which has a hydrogen molecule content of less than $1 \times 10^{17}$ molecules/cm$^3$, which has an OH group concentration of at most 30 ppm, and contains reduction type defects not higher than the detectable limit, and wherein the synthetic silica glass prior to vitrification contains reduction type defects not higher than the detectable limit.

2. The process according to claim 1, wherein the hydrogen molecule content of the synthetic silica glass optical component produced is at least $5 \times 10^{17}$ molecules/cm$^3$.

3. The process according to claim 1, wherein the pressure is from 5 to 20 atms and the temperature is from 400 to 600° C.

4. The process according to claim 1, wherein the hydrogen gas-containing atmosphere comprises hydrogen gas and an inert gas.

5. The process according to claim 1, wherein the pressure is from 5 to 10 atms.

6. The process according to claim 1, wherein the temperature is from 400 to 550° C.

7. The process according to claim 1, wherein the temperature is from 400 to 500° C.

\* \* \* \* \*